US006839394B1

(12) United States Patent
Duffy (10) Patent No.: US 6,839,394 B1
(45) Date of Patent: *Jan. 4, 2005

(54) FREQUENCY DIFFERENCE DETECTOR WITH HYSTERESIS

(75) Inventor: Michael L. Duffy, Austin, TX (US)

(73) Assignee: Cypress Semiconductor Corp., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/015,989

(22) Filed: Jan. 30, 1998

Related U.S. Application Data (60) Provisional application No. 60/066,152, filed on Nov. 19, 1997.

(51) Int. Cl.[7] .................................................. H03D 3/27
(52) U.S. Cl. ....................................................... 375/376
(58) Field of Search ................................ 375/371, 354, 375/373–376; 327/156, 159; 331/1 R, 10, 11, 25, 1 A, DIG. 2

(56) References Cited

U.S. PATENT DOCUMENTS 5,512,860 A * 4/1996 Huscroft et al. ............. 331/1 A
5,764,712 A * 6/1998 Branstad et al. ............. 375/376
5,774,022 A * 6/1998 Griffin et al. ................ 375/376

OTHER PUBLICATIONS

Cypress Preliminary CY7C955 AX™ ATM–SONET/SDH Transceive, Jul. 25, 1997, pp. 1–77.

* cited by examiner

Primary Examiner—Kevin Burd
(74) Attorney, Agent, or Firm—Christopher P. Maiorana, PC (57) ABSTRACT

A scheme (e.g., one or more methods, circuits and/or architectures) for detecting the difference in frequencies between two periodic (e.g., clock) signals and/or for reliably assuring the frequency of an oscillating circuit (e.g., a voltage controlled oscillator [VCO], a phase locked loop [PLL] containing a VCO, etc.). The present invention is particularly useful for clock recovery in data communications devices and more particularly in asynchronous transfer mode (ATM) devices, such as SONET/SDH transmitters, receivers and/or transceivers.

16 Claims, 7 Drawing Sheets

FREQUENCY DIFFERENCE DETECTOR WITH HYSTERESIS

This application claims the benefit of U.S. Provisional Application No. 60/066,152, filed Nov. 19, 1997, which is hereby incorporated by reference in its entirety.

FIELD OF THE INVENTION

The present invention concerns frequency difference detector circuits generally, and more particularly, a circuit, method and/or architecture for detecting the difference between two periodic signals.

BACKGROUND OF THE INVENTION

Figure 1:
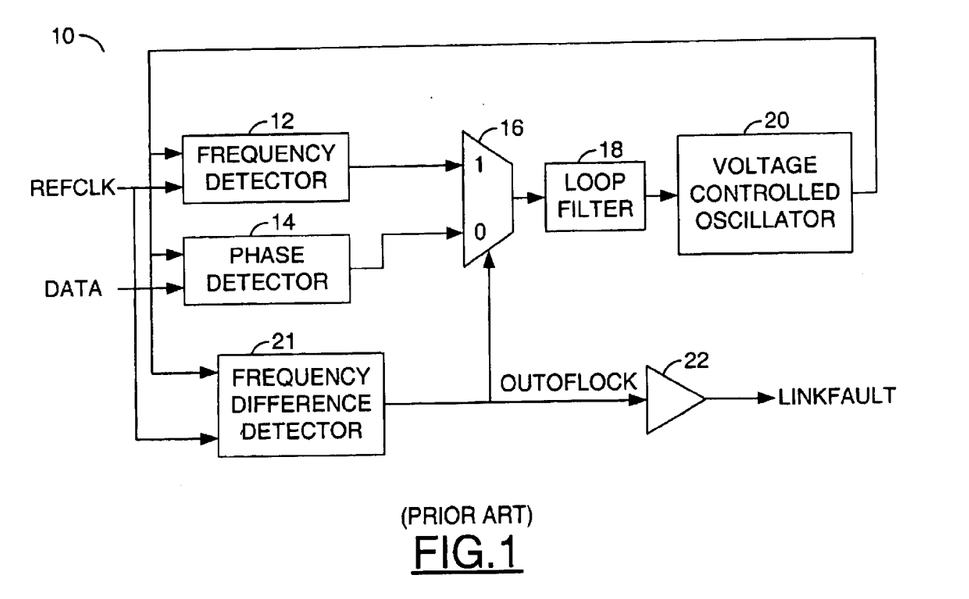
FIG. 1 shows a diagram of a conventional PLL having an Out-of-lock signal-generating scheme based on a single predetermined acceptable frequency window.

Referring to FIG. 1, a circuit (or phase locked loop (PLL)) 10 is shown illustrating a conventional scheme for clock recovery. The circuit 10 generally comprises a frequency detector 12, a phase detector 14, a multiplexor 16, a loop filter 18, a voltage controlled oscillator (VCO) 20, a frequency difference detector 21 and a buffer 22. The PLL 10 uses the frequency detector 12 and the frequency different detector 21 to ensure that the frequency of a signal presented by the VCO 20 is within a predetermined frequency range relative to an external reference signal (e.g., REFCLK) presented to the frequency detector 12. The frequency detector 12 generates pulses whose width is proportional to frequency difference of the incoming signals. The phase detector 14 ensures that the phase of the signal presented by the VCO 20 is aligned with an incoming data stream (e.g., DATA) presented to the phase detector 14. The frequency difference detector generates a control signal (e.g., LINKFAULT) indicating the status of the VCO frequency to the PLL compared to an external device (not shown). The signal to the external device is typically sent through a dedicated output pin connected to the buffer 22.

Figure 2:
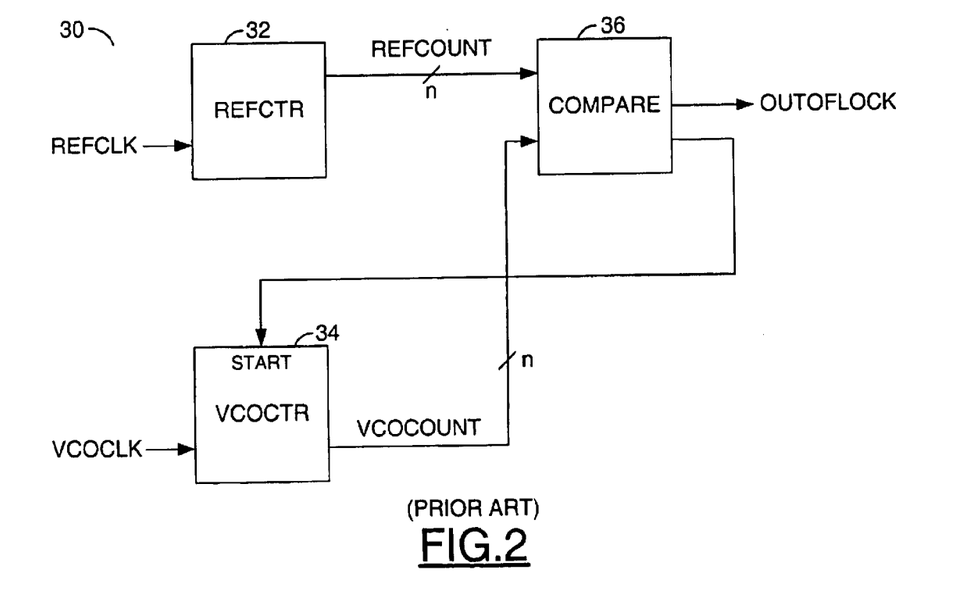
FIG. 2 illustrates a diagram of a conventional clock recovery scheme that may be implemented in the PLL of FIG. 1.

Referring to FIG. 2, a circuit 30 illustrating a conventional scheme for detecting the difference in frequencies between two clock signals is shown. The circuit 30 comprises a counter 32, a counter 34 and a compare block (or circuit) 36. The counter 32 counts the cycles of a reference clock signal (e.g., REFCLK). The counter 34 counts the cycles of a VCO clock signal (e.g., VCOCLK). The circuit 30 uses a signal START to initiate the VCO clock signal counter 34. The signal START may be generated periodically (i.e., once every certain number of cycles) to provide a periodic timing reference. The counter 32 tracks the number of VCO clock signal cycles to generate a count signal (e.g., via VCO_COUNT). The counter 34 counts the number of reference clock signal cycles to generate a count signal (e.g., via REF_COUNT). The compare circuit 36 compares the signal VCO_COUNT with the signal REF_COUNT to determine whether or not the VCO is presenting (or generating) a clock signal having a frequency within a predetermined window (i.e., within predetermined upper and lower boundaries, or a predetermined frequency range, relative to the reference clock signal REFCLK). The compare circuit 36 indicates that the VCO clock signal frequency is not within the predetermined window by presenting an active control signal (e.g., OutOfLock).

The circuit 30 gives rise to a problem in that an Out-of-lock signal (OOL) may be inadvertently or prematurely deactivated when the PLL pulls its output signal within the allowable predetermined frequency window, only to be reasserted a very short time later (typically less than 100 msec but at least one range compare cycle later; in one example, at least 50 μsec.) The inadvertent or premature deactivation of the signal OOL typically occurs as a result of jitter or noise or an artifact of the frequency-centering process. The signal OOL may "glitch" which may make designing a circuit board very difficult, particularly when the signal OOL appears at an I/O pin.

SUMMARY OF THE INVENTION

The present invention concerns a scheme (e.g., one or more methods, circuits and/or architectures) for detecting the difference in frequencies between two periodic (e.g., clock) signals and/or for reliably assuring the frequency of an oscillating circuit (e.g., a voltage controlled oscillator [VCO], a phase locked loop [PLL] containing a VCO, etc.). The present invention is particularly useful for clock recovery in data communications devices and more particularly in asynchronous transfer mode (ATM) devices, such as SONET/SDH transmitters, receivers and/or transceivers.

The objects, features and advantages of the present invention include (i) providing a reliable method, circuit and/or architecture for detecting the difference in frequencies between two periodic signals, (ii) indicating the acceptability of an oscillating circuit frequency, and/or (iii) providing clock recovery in a data communications device. A further object of the present invention is to provide a data communications device such as a SONET/SDH transmitter, receiver or transceiver configured to conduct such a method, or including such a circuit or architecture.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
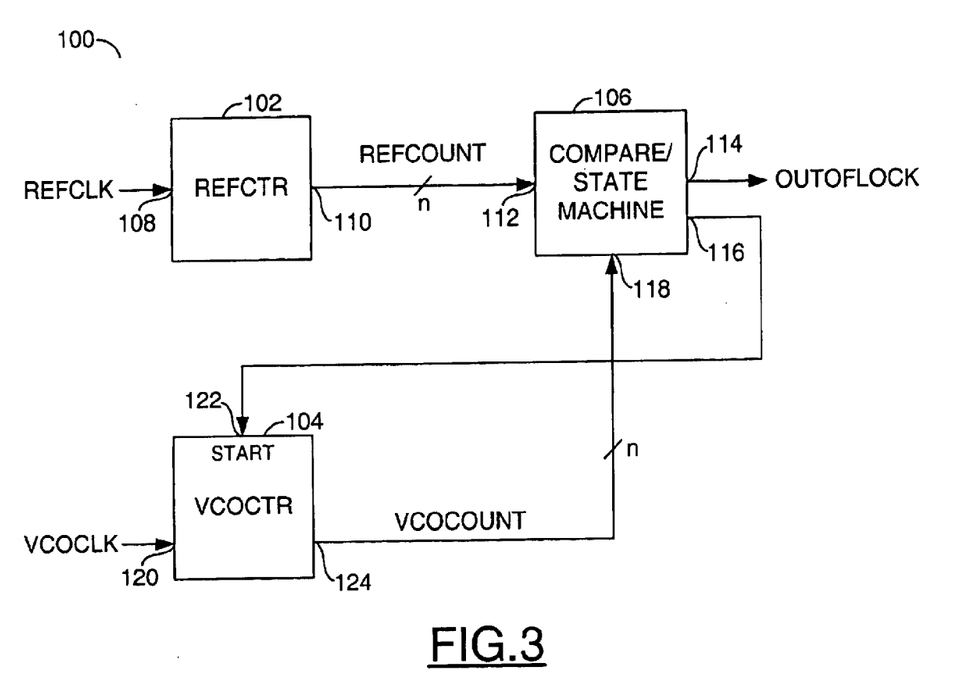
FIG. 3 illustrates a diagram of a first embodiment of a clock recovery scheme of the present invention suitable for use in a PLL such as that of FIG. 1.

FIG. 3 illustrates a frequency difference detection circuit 100 in accordance with a preferred embodiments of the present invention. The circuit 100 generally comprises a counter 102, a counter 104 and a compare/state machine 106. The counter 102 generally comprises an input 108 configured to receive a reference clock signal (e.g., REFCLK) and an output 110 configured to present a reference count signal (e.g., REF_COUNT). The compare/state machine 106 comprises an input 112 that may receive the signal REF_COUNT, an output 114 that may present an Out-Of-Lock signal (e.g., OutOfLock), an output 116 that may present a signal to the counter 104 and an input 118 that may receive a signal from the counter 104. The counter 104 generally comprises an input 120 that may receive a VCO clock signal (e.g., VCOCLK), an input 122 that may receive the signal (e.g., START) from the output 116 of the compare/state machine 106, and an output 124 that may present a signal (e.g., VcoCount) to the input 118 of the compare/state machine 106. The signal REF_COUNT and the signal VcoCount may be multi-bit signals (e.g., an n-bit signal). The circuit 100 generally assures that the signal OutOfLock is not deasserted prior to an output of the VCO being safely within an outer predetermined window of acceptability. The circuit 100 may minimize the inadvertent (or temporary) deassertion of the OutOfLock signal during frequency and/or phase correction due to noise or jitter. The circuit 100 may be used in any PLL, but may be particularly useful as a frequency difference detector in the PLL of FIG. 1.

The compare/state machine 106 may include a state machine that provides hysteresis to the signal OutOfLock. The compare/state machine 106 may be configured to determine when the VCO/PLL clock signal is within either or both of at least two predetermined windows of acceptability. An outer window may primarily be an indicator of the VCO/PLL falling outside the range of acceptable frequencies ("out of lock") and an inner window may primarily be an indicator of the VCO/PLL operating safely within the range of acceptable frequencies ("in lock"). In response to the state machine output(s), the compare circuit generates an out-of-lock control signal which indicates the VCO clock signal status as described above.

Figure 4:
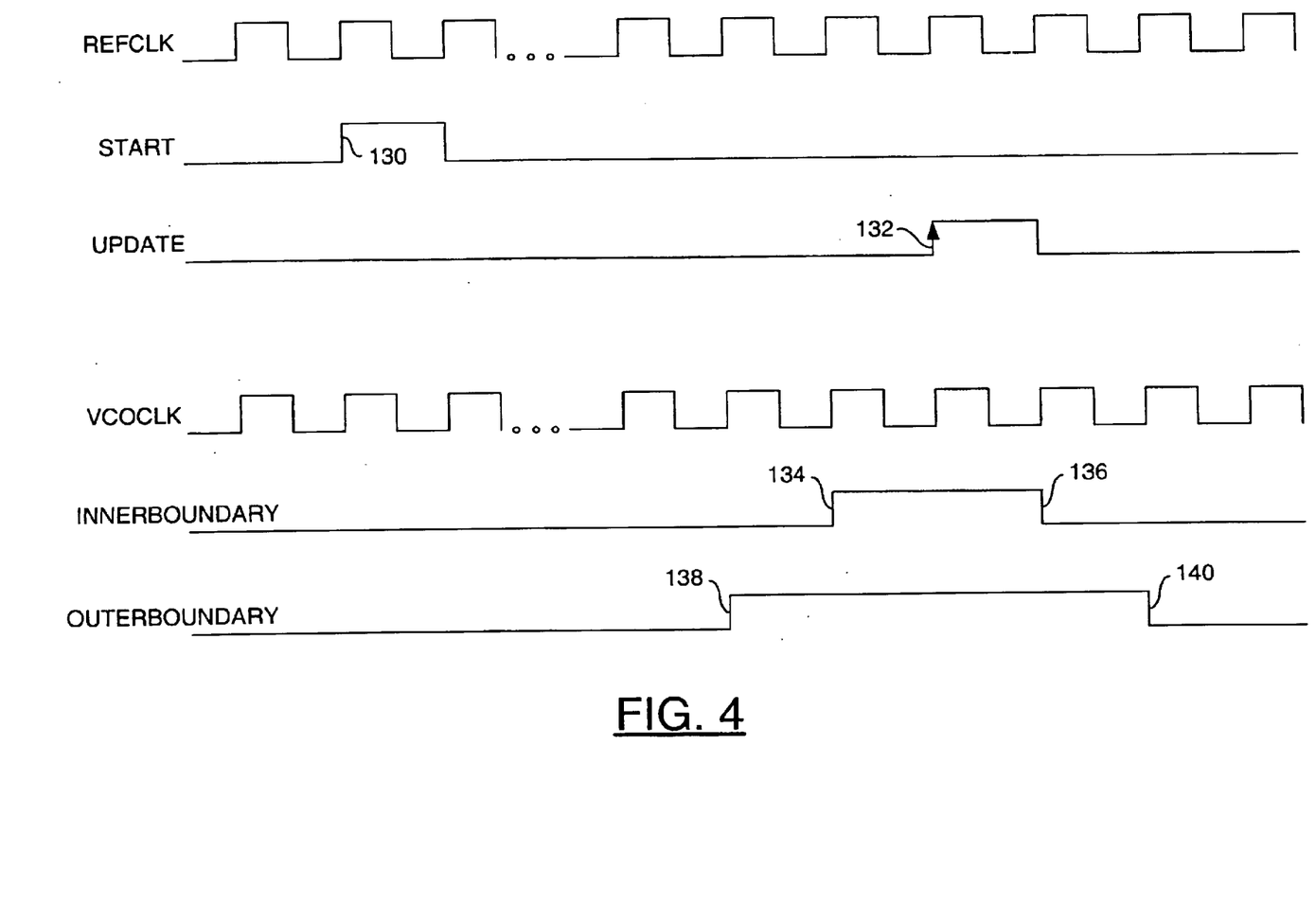
FIG. 4 illustrates a timing diagram of various waveforms generated by the circuit of FIG. 3.

Referring to FIG. 4, a timing diagram of the various signals generated by the circuit 100 is shown. The signal REFCLK is shown generally as a periodic signal. The signal START has a transition 130 that begins the execution of the VCO counter 104. The signal UPDATE has a transition 132 that generally indicates an update to the VCO frequency shall occur. The signal InnerBoundary has a transition 134 and a transition 136 that generally define the InnerBoundary of operating frequencies that are acceptable. The signal OuterBoundary has a transition 138 and a transition 140 that generally define the outer range of acceptable frequencies.

Figure 5A:
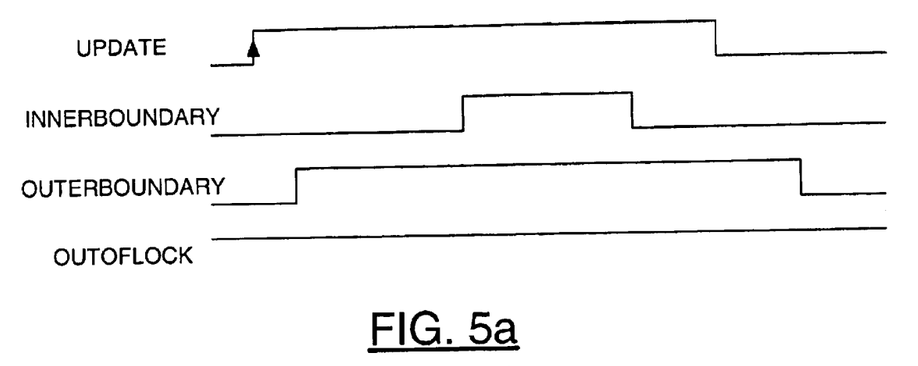
FIGS. 5(a), 5(b), 5(c), 5(d), 5(e) and 5(f) illustrate timing diagrams of signals presented and received from the compare/state machine circuitry of FIG. 3.
Figure 5B:
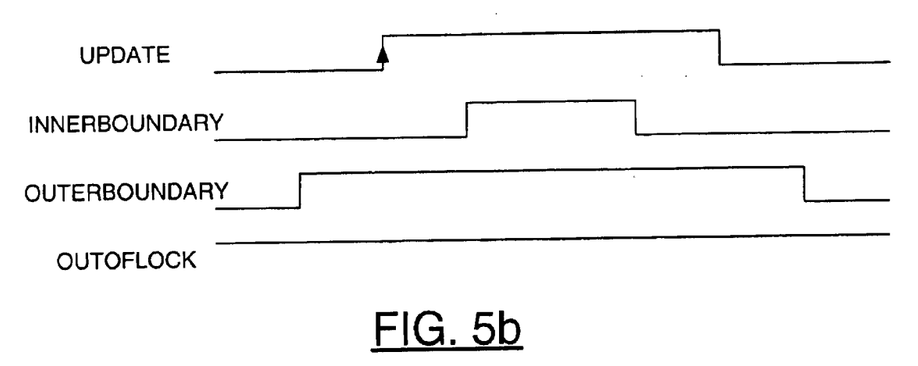
Figure 5C:
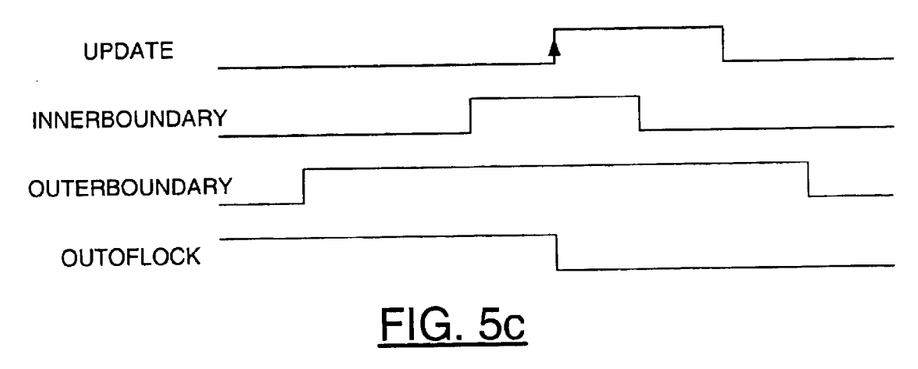

FIGS. 5a, 5b, 5c, 5(d), 5(e) and 5(f) illustrate exemplary waveforms for signals received by and presented from the compare/state machine 106. In FIGS. 5(a), 5(b) and 5(c), the first signal Update represents a reference clock timing signal derived from the reference clock counter 102. For example, the reference clock timing signal may be a decoded reference clock signal (e.g., one that exhibits a rising and falling transition once every predetermined number of cycles, such as every 2n cycles, every m·$2^n$ cycles, or every $(m/p)2_n$ cycles, where n is a number of at least 2, preferably from 5 to 20, and m and p are each independently a number from 1 to 9, preferably from 1 to 6).

The compare/state machine 106 may track a transition of the reference clock timing signal (e.g., the rising edge of Update) and generate an output signal in response thereto. The second and third signals (i.e., InnerBoundary and OuterBoundary, respectively) may represent the inner acceptable frequency window (indicating the VCO clock signal operating safely within the range of acceptable frequencies) and the outer acceptable frequency window (indicating the VCO clock signal falling outside the range of acceptable frequencies). In one example, the boundary signals may be decoded signals received from the VCO clock counter. The signal OutOfLock may represent the signal presented at output 114 which may be generated in response to the reference clock timing signal transition (e.g., Update). The signal OutOfLock may have a state that may depend on the states of the boundary signals. The compare/state machine 106 may generate the signal OutOfLock by conventional logic circuits (e.g., AND, NAND, OR, NOR, XOR, XNOR, etc.) in accordance with known practices and techniques.

In FIG. 5(a), the rising (or triggering) edge of the signal UPDATE occurs outside the logic HIGH portion of both the signal, InnerBoundary and the signal OuterBoundary, indicating the VCO clock signal frequency is not within the range of acceptable frequencies. Consequently, the signal OutOfLock remains asserted (e.g., in an active HIGH binary logic state).

In FIG. 5(b), the rising (or triggering) edge of the signal UPDATE occurs when the signal, InnerBoundary is at a logic LOW and the signal OuterBoundary is at a logic HIGH, also indicating the VCO clock signal frequency is not within the range of acceptable frequencies. Consequently, the signal OutOfLock remains asserted (e.g., in an active HIGH binary logic state).

In FIG. 5(c), the rising (or triggering) edge of the signal UPDATE occurs when both the signal InnerBoundary and the signal OuterBoundary are at a logic HIGH, indicating that the VCO clock signal frequency is within the range of acceptable frequencies. Consequently, the signal OutOfLock may be deasserted (e.g., an active LOW binary logic state).

Figure 5D:
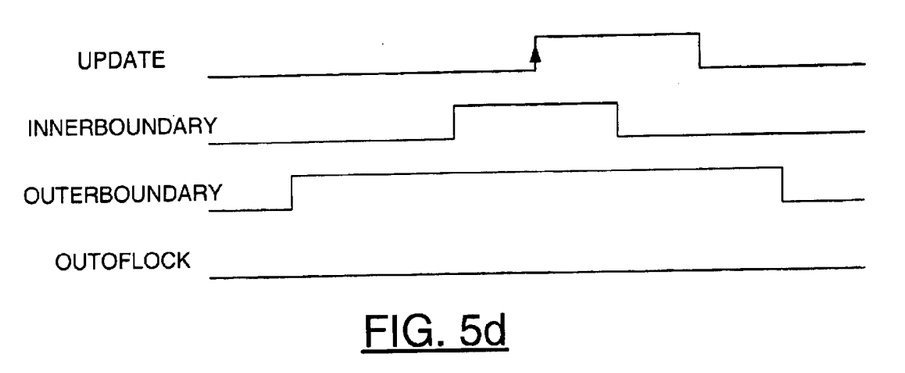

In FIG. 5(d), the rising (or triggering) edge of the signal UPDATE occurs when both the signal InnerBoundary and the signal OuterBoundary are at a logic HIGH, indicating that the VCO clock signal frequency is inside the range of acceptable frequencies. Consequently, the signal OutOfLock generally remains deasserted (e.g., as an active LOW binary logic state) since the VCO clock signal frequency is inside the acceptable range.

Figure 5E:
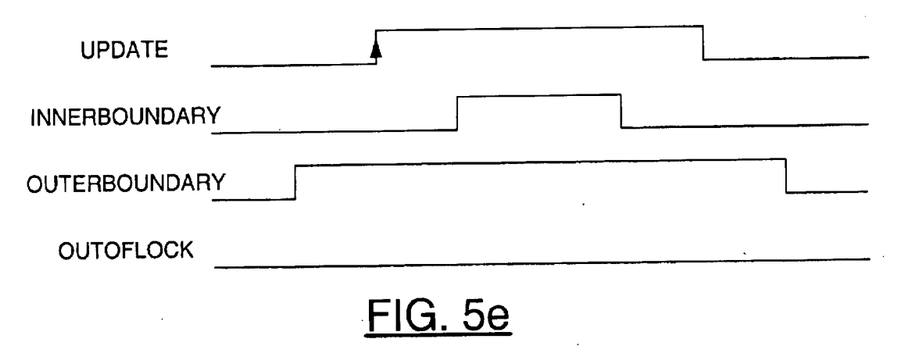

In FIG. 5(e), the rising (or triggering) edge of the signal UPDATE occurs when the signal InnerBoundary is at a logic LOW and the signal OuterBoundary is at a logic HIGH, indicating that the VCO clock signal frequency is in the intermediate range of frequencies. Consequently, the signal OutOfLock generally remains deasserted (e.g., in an active LOW binary logic state) since the VCO clock signal frequency may return to within the acceptable range.

Figure 5F:
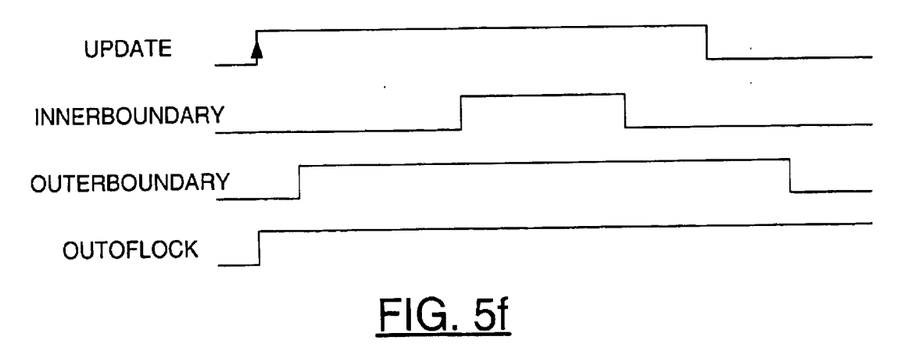

In FIG. 5(f), the rising (or triggering) edge of the signal UPDATE occurs when both the signal, InnerBoundary and the signal OuterBoundary are LOW, indicating that the VCO clock signal frequency is not within the range of acceptable frequencies. Consequently, the signal OutOfLock generally may be asserted since the VCO clock signal frequency may no longer be within the acceptable range.

Figure 6:
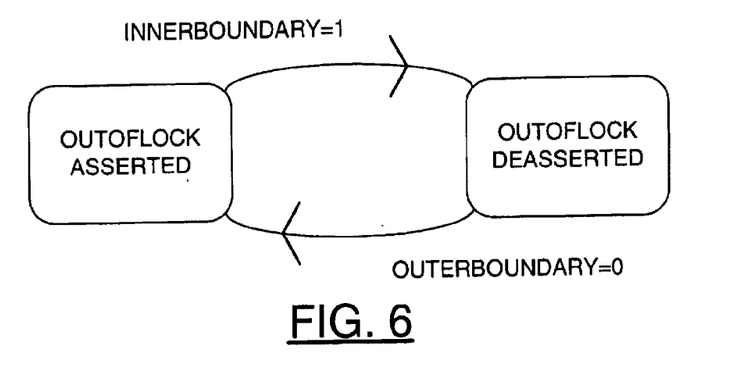
FIG. 6 illustrates an exemplary state diagram for the state machine of FIG. 3.

The inner and outer acceptable frequency windows are selected and generated such that (i) the rising transitions of the inner acceptable frequency window signal generally occur after the rising transitions of the outer acceptable frequency window and (ii) the falling transitions of the inner acceptable frequency window signal generally occur before the falling transitions of the outer acceptable frequency window. One consequence of this configuration may be that the reference clock timing signal may trigger transitions between an active inner and outer acceptable frequency window signals (see, e.g., FIG. 5(c), where both inner and outer acceptable frequency window signals are active HIGH binary logic state signals), which may not affect the state of the signal OutOfLock. Thus, the state diagram for the present state machine 106 may be represented by FIG. 6.

In other words, once an "out-of-lock" state is asserted, a device containing the present invention may indicate the "out-of-lock" state until the frequency difference between the VCO clock and the reference clock is less than x ppm. After the "out-of-lock" state is deasserted, the signal OutOfLock may stay deasserted until the frequency difference between the VCO clock and the reference clock is greater than y ppm, where y>x (preferably, y≧1.1x, more preferably, y≧1.5x, even more preferably, y≧2x, and most preferably, y≧2.5x). In one embodiment, x is about 500 ppm and y is about 1500 ppm (y≧3x) for a PLL receiving either a 6.48 MHZ or 19.44 MHZ reference clock signal. However, further examples of x and y may include those where x is from 20 to 5000 ppm, preferably from 50 to 3000 ppm, more preferably from 100 to 1000 ppm, and where y is from 50 to 10,000 ppm, preferably from 100 to 5000 ppm, more preferably from 200 to 3000 ppm.

One benefit of the circuit 100 may be the ability to minimize the likelihood of an inadvertent deassertion of the signal OutOfLock. The built-in hysteresis of the present compare/state machine 106 generally minimizes the probability of falsely deasserting an out-of lock state, only to reassert the true out-of-lock state a very short time later. As a result, the present invention may help to avoid unusual (or defective) start-up signal sequences in circuit boards containing a data communications device comprising the present clock recovery-based PLL.

Figure 7:
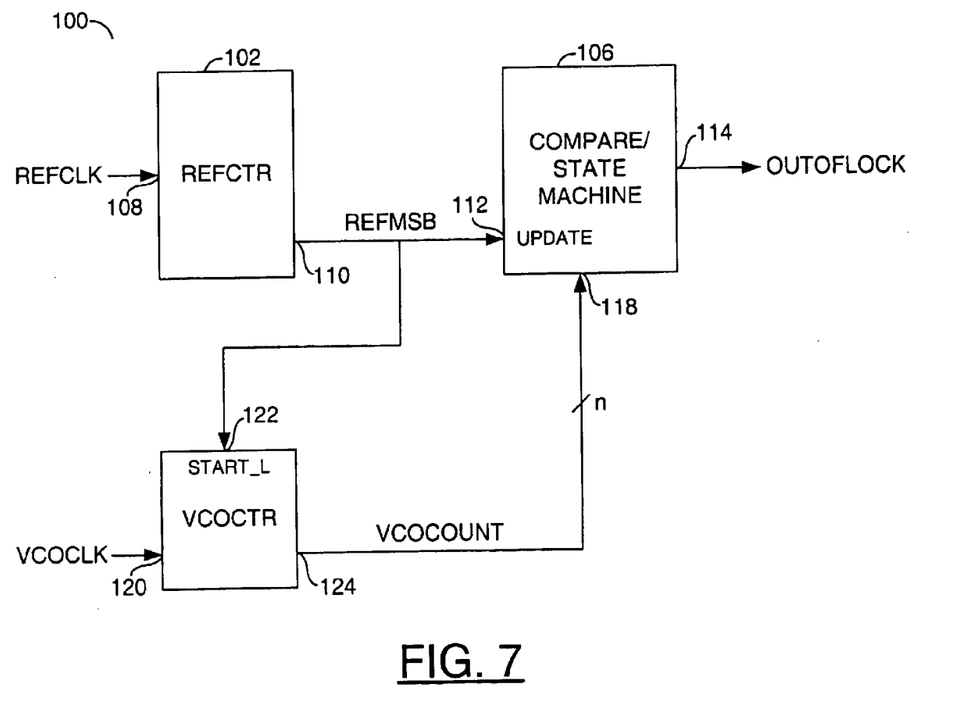
FIG. 7 illustrates a diagram of a second embodiment of the clock recovery scheme of the present invention, also suitable for use in a PLL such as that of FIG. 1.

Referring to FIG. 7, a circuit 100' illustrates an alternate embodiment of the present invention. Comparing the circuit 100' to the circuit 100, in circuit 100', the VCO clock counter is enabled (initiated) by the most significant bit of the reference clock counter output signal (e.g., RefMsb). At the same time, a signal RefMsb may replace the decoded reference clock counter output signal (e.g., the signal Update in FIGS. 5(a)-(c)), which may simplify the circuitry and minimize the effects of process variations which may be inherent in making the circuitry. Alternatively, the decoded reference clock counter output signal may be generated in response to the signal RefMsb. However, similar to the circuit 100, the decoded reference clock counter output signal may be generated simply in response to the reference clock counter output (not shown in FIG. 6).

Figure 8:
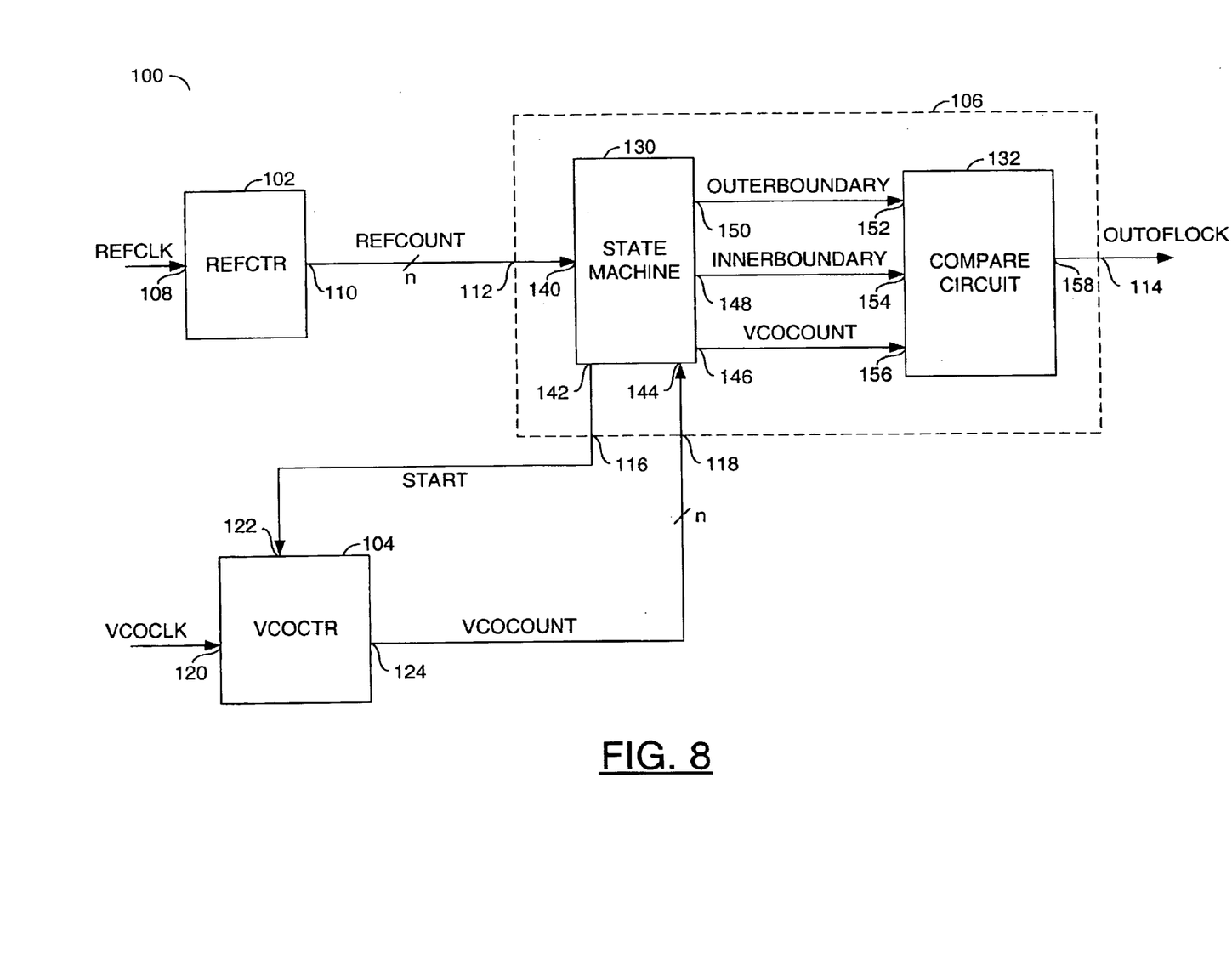
FIG. 8 is a detailed block diagram illustrating the embodiment of FIG. 3.

Referring to FIG. 8, a detailed block diagram illustrating the circuit 100 is shown. In one example, the circuit 106 may comprise a circuit 130 and a circuit 132. The circuit 130 may have an input 140 that may receive the signal RefCount, an output 142 that may present the signal START, an input 144 that may receive the signal VcoCount, an output 146 that may present the signal VcoCount, an output 148 that may present the signal InnerBoundary, and an output 150 that may present the signal OuterBoundary. The circuit 132 may have an input 152 that may receive the signal OuterBoundary, an input 154 that may receive the signal InnerBoundary, an input 156 that may receive the signal VcoCount and an output 158 that may present the signal OutOfLock. The circuit 130 may be, in one implementation, a state machine. The circuit 132 may be a compare circuit.

While the invention has been particularly shown and described with reference to the preferred embodiments thereof, it will be understood by those skilled in the art that various changes in form and details may be made without departing from the spirit and scope of the invention.

What is claimed is:

1. A frequency difference detector, comprising:
    a compare circuit configured to generate a signal indicating an out-of-lock status in response to one or more state machine outputs, and
    a state machine configured to (i) generate said one or more state machine outputs in response to a plurality of independent periodic signals and (ii) provide hysteresis between asserting and de-asserting said out-of-lock signal, wherein said one or more state machine outputs comprise (i) an inner frequency signal indicating that a voltage controlled oscillator output signal is operating within an inner range of frequencies and (ii) an outer frequency signal indicating that said voltage controlled oscillator output signal is operating outside an outer range of frequencies greater than said inner range of frequencies.

2. The frequency difference detector of claim 1, wherein said plurality of independent periodic signals comprise a reference clock signal and said voltage controlled oscillator output signal.

3. The frequency difference detector of claim 2, wherein said inner frequency signal comprises an inner acceptable frequency signal indicating that said voltage controlled oscillator output signal is operating safely within a range of acceptable frequencies and said outer frequency signal comprises an outer acceptable frequency signal indicating that said voltage controlled oscillator output signal is operating outside said range of acceptable frequencies.

4. The frequency difference detector of claim 3, wherein said outer range of acceptable frequencies is at least 1.1 times greater than said inner range of acceptable frequencies.

5. The frequency difference detector of claim 4, wherein each of said inner acceptable frequencies and said outer acceptable frequencies are each defined with respect to said reference clock signal.

6. A phase locked loop, comprising the frequency difference detector of claim 1, and one or more of the following elements:
    a voltage controlled oscillator configured to generate said voltage controlled oscillator output signal;
    a phase detector receiving said voltage controlled oscillator output signal and a data stream, configured to generate a phase lock signal in response thereto; and
    a filter circuit coupled to said phase detector and/or said frequency difference detector.

7. The frequency detector according to claim 1, wherein said outer range of frequencies is at least 1.1 times greater than said inner range of frequencies.

8. a method of indicating whether a first periodic signal is parameter locked to a second periodic signal, each of said first periodic signal and said second periodic signal having a parameter value, comprising the steps of:
    asserting an out-of-lock signal when the parameter value of said first periodic signal is more than y ppm different from the parameter value of said second periodic signal; and
    deasserting said out-of-lock signal when the parameter value of said first periodic signal is less than x ppm different from the parameter value of said second periodic signal, wherein y is greater than x, wherein hysteresis is provided between said asserting and de-asserting said out-of-lock signal.

9. The method according to claim 8, wherein said parameter value comprises a frequency.

10. The method according to claim 8, wherein y≧1.1*x.

11. A method of determining whether a first periodic signal is frequency locked to a second periodic signal, comprising the steps of:

generating (i) an inner frequency window signal and (ii) an outer frequency window signal in response to said first periodic signal;

generating an active out-of-lock signal in response to said second periodic signal when the frequency of said first periodic signal is outside the outer frequency window; and generation an inactive out-of-lock signal in response to said second periodic signal when the frequency of said second periodic signal is inside the inner frequency window, wherein (i) and outer frequency window is greater than said inner frequency window and (ii) hysteresis is provided between said active out-of-lock and said inactive out-of-lock signals.

12. The method according to claim 11, wherein said inactive and said active out-of-lock signals comprise a global out-of-lock signal having (i) a first state when the frequency of said second periodic signal is outside the outer frequency window and (ii) a second state when the frequency of said second periodic signal is inside the inner frequency window.

13. The method according to claim 12, wherein said first state of said global out-of-lock signal indicates that the first periodic signal is not frequency-locked to said second periodic signal, and said second state of said global out-of-lock signal indicates that the first periodic signal is frequency-locked to said second periodic signal.

14. The method of claim 11, wherein said active out-of-lock signal indicates that the first periodic signal is not frequency-locked to said second periodic signal, and said inactive out-of-lock signal indicates that the first periodic signal is frequency-locked to said second periodic signal.

15. The method according to claim 11 wherein:

said first periodic signal is an oscillating circuit output signal; and said second periodic signal is a reference clock signal.

16. The method according to claim 11, wherein said outer frequency window is at least 1.1 times greater than said inner frequency window.

* * * * *